US012684686B2

(12) United States Patent　　　　(10) Patent No.: US 12,684,686 B2
Kato et al.　　　　　　　　　　　　(45) Date of Patent: Jul. 14, 2026

(54) WIRING SUBSTRATE

(71) Applicant: IBIDEN CO., LTD., Ogaki (JP)

(72) Inventors: Masataka Kato, Ogaki (JP); Shunsuke Sakai, Ogaki (JP); Masahide Tawatari, Ogaki (JP); Kosuke Ikeda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 351 days.

(21) Appl. No.: 18/307,131

(22) Filed: Apr. 26, 2023

(65) Prior Publication Data

US 2023/0380055 A1　Nov. 23, 2023

(30) Foreign Application Priority Data

May 19, 2022　(JP) ................................. 2022-082280

(51) Int. Cl.
　H05K 1/02　　　(2006.01)
　H05K 1/11　　　(2006.01)
　H05K 3/46　　　(2006.01)
　*H05K 1/181*　　　(2026.01)
(52) U.S. Cl.
　CPC ........... *H05K 1/0271* (2013.01); *H05K 1/113* (2013.01); *H05K 3/4673* (2013.01); *H05K 1/181* (2013.01)
(58) Field of Classification Search
　USPC ...................................................... 174/255
　See application file for complete search history.

(56) References Cited

U.S. PATENT DOCUMENTS

| | | | | |
|---|---|---|---|---|
| 8,471,154 | B1 * | 6/2013 | Yoshida .............. | H01L 23/3128 |
| | | | | 174/262 |
| 10,368,438 | B2 * | 7/2019 | Nishioka ................... | G03F 7/32 |
| 10,602,622 | B2 * | 3/2020 | Harazono .............. | H05K 3/067 |
| 2009/0236128 | A1 * | 9/2009 | Tsukada ................. | H05K 3/386 |
| | | | | 156/60 |
| 2017/0013710 | A1 * | 1/2017 | Wang ..................... | H05K 3/244 |
| 2020/0020603 | A1 * | 1/2020 | Tsao .................. | H01L 23/49816 |

FOREIGN PATENT DOCUMENTS

JP　　　2004-022713 A　　1/2004

* cited by examiner

*Primary Examiner* — Timothy J Thompson
(74) *Attorney, Agent, or Firm* — Finnegan, Henderson, Farabow, Garrett & Dunner, LLP

(57)　　　ABSTRACT

A wiring substrate includes a core substrate, a build-up part formed on a surface of the substrate and including insulating layers and conductor layers, and a covering insulating layer formed on the build-up part such that the covering layer is covering the outermost surface of the build-up part. The build-up part is formed such that the insulating layers include a first insulating layer forming the outermost one of the insulating layers, that the conductor layers include a first conductor layer formed on the first insulating layer and including a first conductor pad, and that a tensile strength of the first insulating layer is higher than a tensile strength of each insulating layer other than the first insulating layer in the first build-up part, and the covering layer is formed such that the covering layer has opening entirely exposing an upper surface and a side surface of the first conductor pad.

20 Claims, 4 Drawing Sheets

WIRING SUBSTRATE

CROSS-REFERENCE TO RELATED APPLICATIONS

The present application is based upon and claims the benefit of priority to Japanese Patent Application No. 2022-082280, filed May 19, 2022, the entire contents of which are incorporated herein by reference.

BACKGROUND OF THE INVENTION

Field of the Invention

The present invention relates to a wiring substrate.

DESCRIPTION OF BACKGROUND ART

Japanese Patent Application Laid-Open Publication No. 2004-22713 describes a multilayer wiring substrate having a pad part that is formed on an insulating layer and is bonded to a semiconductor element. The entire contents of this publication are incorporated herein by reference.

SUMMARY OF THE INVENTION

According to one aspect of the present invention, a wiring substrate includes a core substrate, a build-up part formed on a surface of the core substrate and including insulating layers and conductor layers, and a covering insulating layer formed on the build-up part such that the covering insulating layer is covering an outermost surface of the build-up part. The build-up part is formed such that the insulating layers include a first insulating layer forming the outermost one of the insulating layers, that the conductor layers include a first conductor layer formed on the first insulating layer and including a first conductor pad, and that a tensile strength of the first insulating layer is higher than a tensile strength of each of the insulating layers other than the first insulating layer in the first build-up part, and the covering insulating layer is formed such that the covering insulating layer has an opening entirely exposing an upper surface and a side surface of the first conductor pad.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
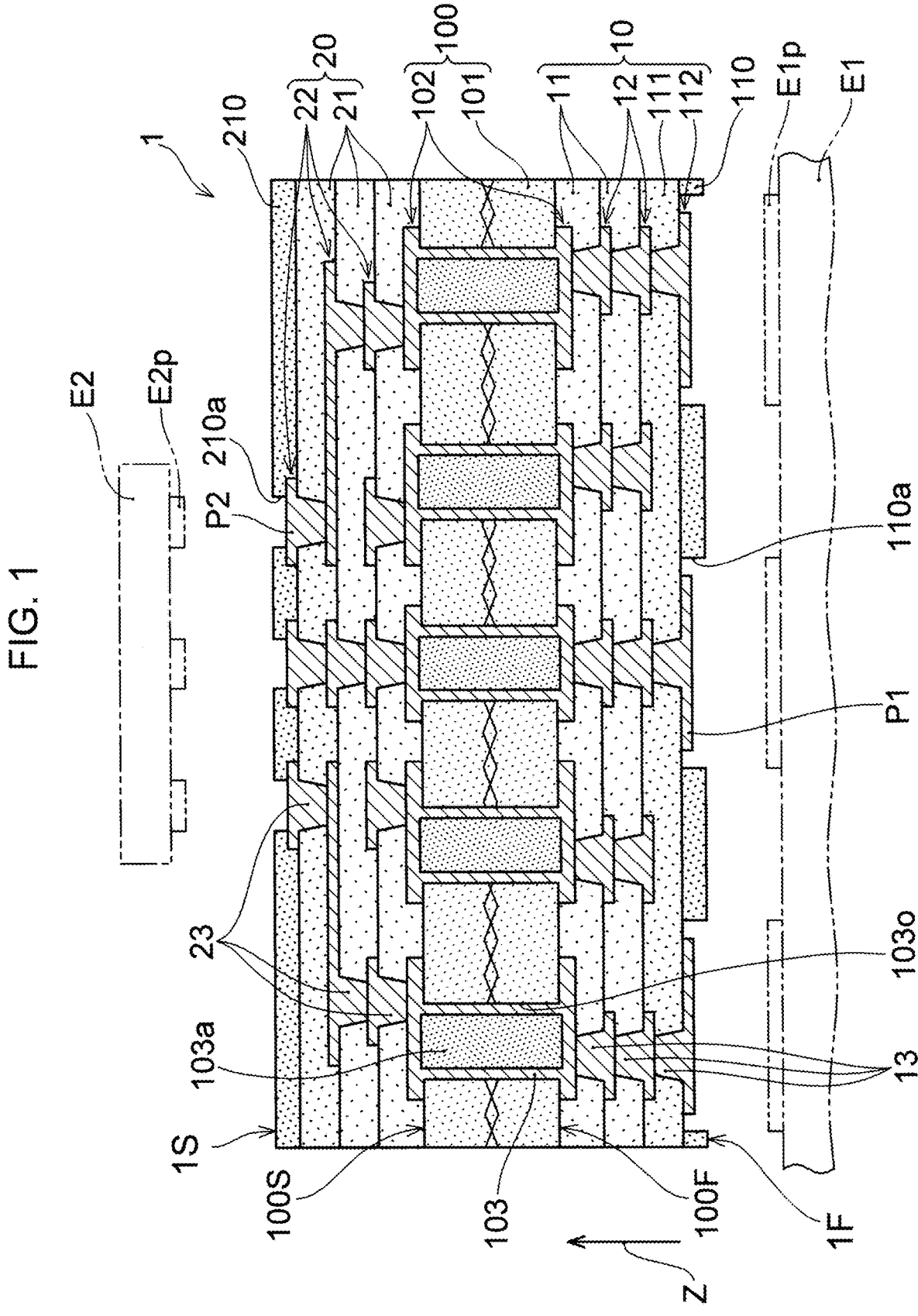
FIG. 1 is a cross-sectional view illustrating an example of a wiring substrate according to an embodiment of an embodiment of the present invention.

Embodiments will now be described with reference to the accompanying drawings, wherein like reference numerals designate corresponding or identical elements throughout the various drawings.

Figures 2, 3A:
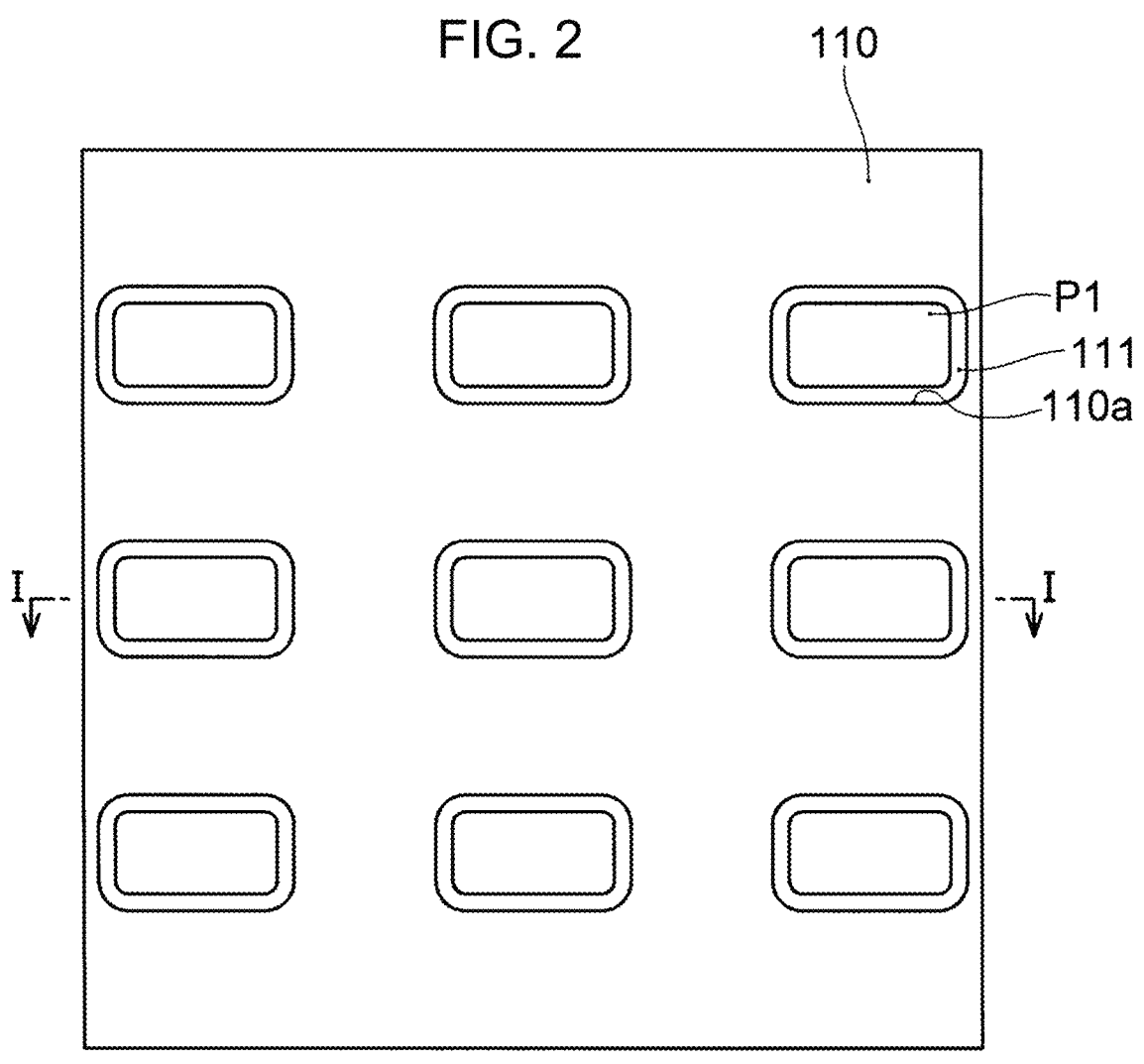
FIG. 2 is a plan view illustrating an example of a wiring substrate according to an embodiment of the present invention.
FIG. 3A is a cross-sectional view illustrating an example of a method for manufacturing a wiring substrate according to an embodiment of the present invention.

A wiring substrate according to an embodiment of the present invention is described with reference to the drawings. FIG. 1 illustrates a cross-sectional view of a wiring substrate 1, which is an example of the wiring substrate of the embodiment. FIG. 2 illustrates a plan view of the wiring substrate 1 from a lower surface side in FIG. 1. A cross-sectional view along an I-I line of FIG. 2 is FIG. 1.

As illustrated in FIG. 1, the wiring substrate 1 includes a core substrate 100 that includes an insulating layer (core insulating layer) 101 and conductor layers (core conductor layers) 102 that are respectively formed on both sides of the core insulating layer 101. On each of both sides of the core substrate 100, insulating layers and conductor layers are alternately laminated. In the illustrated example, a first build-up part 10 in which insulating layers (11, 111) and conductor layers (12, 112) are laminated is formed on a first surface (100F) of the core substrate 100. Further, a second build-up part 20 in which insulating layers 21 and conductor layers 22 are laminated is formed on a second surface (100S) of the core substrate 100.

In the description of the wiring substrate of the present embodiment, a side farther from the core insulating layer 101 is referred to as "upper," "upper side," "outer side," or "outer," and a side closer to the core insulating layer 101 is referred to as "lower," "lower side," "inner side," or "inner." Further, for each of the structural components, a surface facing the opposite side with respect to the core substrate 100 is also referred to as an "upper surface," and a surface facing the core substrate 100 side is also referred to as a "lower surface." Therefore, in the description of each of the elements of the wiring substrate 1, a side farther from the core substrate 100 is also referred to as an "upper side," "upper-layer side," or "outer side," or simply "upper" or "outer," and a side closer to the core substrate 100 is also referred to as a "lower side," "lower-layer side," or "inner side," or simply "lower" or "inner."

Among the insulating layers of the first build-up part 10, the outermost insulating layer 111 is also referred to as the first insulating layer 111. Further, among the conductor layers of the first build-up part 10, the outermost conductor layer 112 is also referred to as the first conductor layer 112. A covering insulating layer 110 that covers the first insulating layer 111 exposed from conductor patterns of the first conductor layer 112 is formed on the first build-up part 10. A covering insulating layer 210 is formed on the second build-up part 20. The covering insulating layers (110, 210) may be, for example, solder resist layers that form the outermost insulating layers of the wiring substrate 1.

The wiring substrate 1 has a surface (1F) on one side and a surface (1S) on the opposite side with respect to the surface (1F), as two surfaces of the wiring substrate 1 that extend in a direction orthogonal to a thickness direction of the wiring substrate 1. The thickness direction of the wiring substrate 1 is also simply referred to as a "Z direction." In the illustrated example, the surface (1F) on one side is formed by exposed surfaces of the first insulating layer 111, the first conductor layer 112, and the covering insulating layer 110 in the first build-up part 10 of the wiring substrate 1. Further, the surface (1S) on the other side is formed by exposed surfaces of the outermost conductor layer 22 and the covering insulating layer 210 in the second build-up part 20.

Each of the insulating layers (101, 11, 111, 21) of the wiring substrate 1 may be formed, for example, using an insulating resin such as an epoxy resin, a bismaleimide triazine resin (BT resin) or a phenol resin. The insulating layers (101, 11, 111, 21) may each contain a reinforcing material (core material) such as a glass fiber and/or an inorganic filler such as silica or alumina. Each of the covering insulating layers (110, 210), which are solder resist layers, may be formed using, for example, a photosensitive epoxy resin or polyimide resin, or the like.

In the insulating layer 101 of the core substrate 100, through-hole conductors 103 are formed connecting the conductor layer 102 that forms the first surface (100F) of the core substrate 100 and the conductor layer 102 that forms the second surface (100S) of the core substrate 100. The through-hole conductors 103 are integrally formed with the two conductor layers 102. The through-hole conductors 103 are formed along inner walls of through holes (103o) penetrating the insulating layer 101 and each have a tubular shape. Inner sides of the tubular through-hole conductors 103 are each filled with, for example, a resin body (103a) containing any resin such as an epoxy resin. In the insulating layers (11, 111, 21), via conductors (13, 23) connecting the conductor layers sandwiching the insulating layers (11, 111, 21) are formed.

The conductor layers (102, 12, 112, 22), the via conductors (13, 23), and the through-hole conductors 103 may be formed using any metal such as copper or nickel, and, for example, each may be formed of a metal foil such as a copper foil and/or a metal film formed by plating or sputtering or the like. Each of the conductor layers (102, 12, 112, 22), the via conductors (13, 23), and the through-hole conductors 103 is illustrated in FIG. 1 as having a single-layer structure but may have a multilayer structure that includes two or more metal layers. For example, each of the conductor layers 102 that are respectively formed on the surfaces of the insulating layer 101 may have a three-layer structure including a metal foil (preferably, a copper foil), an electroless plating film (preferably, an electroless copper plating film), and an electrolytic plating film (preferably, an electrolytic copper plating film). Further, each of the conductor layers (12, 112, 22), the via conductors (13, 23), and the through-hole conductors 103 may have, for example, a two-layer structure including an electroless plating film and an electrolytic plating film.

The conductor layers (102, 12, 112, 22) of the wiring substrate 1 are each patterned to have predetermined conductor patterns. In particular, the first conductor layer 112 in the first build-up part 10 is formed to have patterns including first conductor pads (P1). The first conductor pads (P1) can be electrically connected with connection pads (E1p) of an external element (E1) that can be connected to the wiring substrate 1 in use of the wiring substrate 1. Further, in the illustrated example, the outermost conductor layer 22 in the second build-up part 20 is patterned to have conductor pads (P2). The conductor pads (P2) can be connected to connection pads (E2p) of an external element (E2).

As illustrated in FIG. 2, the first conductor pads (P1) each have a substantially rectangular planar shape. A "planar shape" is a shape of an object such as a first conductor pad (P1) in a plane view, and "in a plan view" means viewing the object with a line of sight parallel to the Z direction. As illustrated in FIGS. 1 and 2, the covering insulating layer 110 covering the surface (1F) on one side in the first build-up part 10 has openings (110a) exposing the first conductor pads (P1).

The openings (110a) expose surfaces of the first conductor pads (P1) on the opposite side with respect to the first insulating layer 111 and side surfaces of the first conductor pads (P1). That is, the entire side surfaces and upper surfaces of the first conductor pads (P1) are exposed in the openings (110a). The wiring substrate 1 and the external element (E1) can be firmly connected to each other with a large area. In the illustrated example, the covering insulating layer 210 covering the surface (1S) on the other side in the second build-up part 20 has openings (210a) exposing the conductor pads (P2). The covering insulating layer 210 covers peripheral edges of the conductor pads (P2), and portions (upper surfaces) other than the peripheral edges of the conductor pads (P2) are exposed in the openings (210a).

The first conductor pads (P1) can be electrically and mechanically connected to the connection pads (E1p) of the external element (E1) by a bonding material such as solder. The external element (E1) may be a motherboard of any electrical device, or may be any electronic component having a package size larger than the wiring substrate 1. Without being limited to these, the first conductor pads (P1) can be connected to any substrate, electrical component, mechanical component, or the like. In the illustrated example, each of the first conductor pads (P1) is larger than each of the conductor pads (P2) included in the conductor layer 22 provided on the surface (1S) side. It may be possible that the external element (E1), which is larger than the external element (E2), and the wiring substrate 1 are firmly connected to each other with a large area.

In the wiring substrate of the present embodiment, in particular, the first insulating layer 111 in contact with the first conductor pads (P1), of which the upper surfaces and the side surfaces are exposed, has physical properties different from the insulating layers 11 on an inner side of the first insulating layer 111 in the first build-up part 10. Specifically, a tensile strength value of the first insulating layer 111 is greater than a tensile strength value of the insulating layers 11 on the inner side of the first insulating layer 111.

As described above, for example, a stress can occur in the first insulating layer 111 due to a difference in thermal expansion coefficient between the first insulating layer 111 and the first conductor pads (P1), or an external force acting on the first conductor pads (P1), or the like. In this case, in particular, a stress may concentrate near peripheral edges of the first conductor pads (P1) on the surface of the first insulating layer 111, the peripheral edges serving as boundaries between areas where the first conductor pads (P1) are present and areas where the first conductor pads (P1) are not present. Then, a crack may occur in a portion of the first insulating layer 111 that overlaps the peripheral edges of the first conductor pads (P1) when it cannot withstand the stress.

In contrast, in the present embodiment, the first insulating layer 111 in contact with the first conductor pads (P1) is formed of a material with a relatively large tensile strength. It is thought that a breakage due to a stress that can act on the first insulation layer 111 near the first conductor pads (P1) is unlikely to occur and occurrence of a crack can be suppressed. Specifically, the tensile strength of the first insulating layer 111 is preferably 125 MPa or more. The tensile strength value of the first insulating layer 111 may be adjusted by a content of a resin component or a cross-linking agent contained in a material used for the first insulating layer 111, or the like. The tensile strength of the first insulating layer 111 may be adjusted by adjusting a cross-link density of the first insulating layer 111 in a cured state.

In the wiring substrate 1 of the illustrated example, the first conductor pads (P1) are not directly connected to conductor pads and/or wiring patterns, which may be included in the first conductor layer 112, other than the first conductor pads (P1). That is, the first conductor pads (P1) in the illustrated example are so-called independent pads.

Further, in the illustrated example, the first conductor pads (P1) are connected to the via conductors 13 that connect the conductor layers (the first conductor layer 112 and the conductor layer (second conductor layer) 12) sandwiching the first insulating layer 111. Therefore, the first conductor pads (P1) in the illustrated example are so-called via pads. It is thought that since the first conductor pads (P1) are via pads, an external force that can be applied to the first conductor pads (P1) is dispersed to the via conductors 13, and thus, occurrence of a crack in the first insulating layer 111 may be further suppressed.

From a point of view of suppressing transmission loss in signals transmitted via the conductor layers (12, 112, 22) in the first and second build-up parts (10, 20) and realizing a good signal transmission quality, the insulating layers (11, 111, 21) preferably have a relatively small dielectric loss tangent. In particular, the dielectric loss tangent of the first insulating layer 111 is preferably 0.013 or less at a frequency of 5.8 GHz. Since the insulating layers (11, 111, 21) included in the first and second build-up parts (10, 20) are superior in high-frequency characteristics, the wiring substrate 1 has a better signal transmission quality.

In the wiring substrate 1 of the illustrated example, the second build-up part 20, which is provided on the opposite side of the first build-up part 10 with respect to the core substrate 100, has the same layer structure as the first build-up part 10. Specifically, the number of the insulating layers 21 and the number of the conductor layers 22 included in the second build-up part 20 are respectively equal to the number of the insulating layers (11, 111) and the number of the conductor layers (12, 112) included in the first build-up part 10.

In the wiring substrate 1 of the illustrated example, the insulating layers 21 of the second build-up part 20 and the insulating layers (11, 111) of the first build-up part 10 are formed of the same materials. Specifically, in the second build-up part 20 and the first build-up part 10, the insulating layers of the same rank relative to the core substrate 100 are formed using the same material. The term "rank" is a number assigned to each of the conductor layers (12, 112, 22) when the number that increases by 1 for each layer starting from the core substrate 100 side is sequentially assigned starting from 1 to each of the multiple conductor layers (12, 112, 22) laminated in each of the first build-up part 10 and the second build-up part 20. In other words, in the wiring substrate 1 of the illustrated example, the first and second build-up parts (10, 20) are symmetrical in layer structure with respect to the core substrate 100.

Although omitted in FIGS. 1 and 2, the wiring substrate 1 may include a surface treatment layer covering the surfaces of the first conductor pads (P1) and the conductor pads (P2). The surface treatment layer that may be formed on the surfaces of the first conductor pads (P1) and the conductor pads (P2) is, for example, a coating film formed by an anti-corrosion treatment and/or an anti-rust treatment of exposed portions of the first conductor pads (P1) and the conductor pads (P2). The surface treatment layer can prevent corrosion, oxidation, or the like of the conductor pads (P1, P2). The surface treatment layer is, for example, a metal coating film containing a metal different from the conductor pads (P1, P2) or an organic coating film containing an organic substance such as an imidazole compound. When the conductor pads (P1, P2) are formed of copper, the surface treatment layer may be formed of nickel, palladium, silver, gold, or alloys thereof, or solder, or the like.

With reference to FIGS. 3A-3D, a method for manufacturing a wiring substrate is described using a case where the wiring substrate 1 illustrated in FIG. 1 is manufactured as an example. First, as illustrated in FIG. 3A, the core substrate 100 is prepared. In preparing the core substrate 100, for example, a double-sided copper-clad laminate is prepared in which a metal foil is provided on surfaces of the core insulating layer 101. In the double-sided copper-clad laminate, the through holes (103o) are formed, for example, by drilling, and, for example, an electroless plating film is formed on the inner walls of the through holes (103o) and the upper surface of the metal foil, and an electrolytic plating film is formed on the electroless plating film using the electroless plating film as a power feeding layer.

The inner sides of the through-hole conductors 103 formed on the inner walls of the through holes (103o) are filled with the resin bodies (103a) by injecting, for example, an epoxy resin into the inner sides of the through-hole conductors 103. After the filling resin bodies (103a) are solidified, an electroless plating film and an electrolytic plating film are further formed on the resin bodies (103a) and the upper surface of the electrolytic plating film. As a result, the conductor layers 102 each having a five-layer structure including the metal foil, the electroless plating film, the electrolytic plating film, the electroless plating film, and the electrolytic plating film are respectively formed on both sides of the insulating layer 101. Then, the core substrate 100 having predetermined conductor patterns is obtained by patterning the conductor layers 102 using a subtractive method.

Figure 3B:
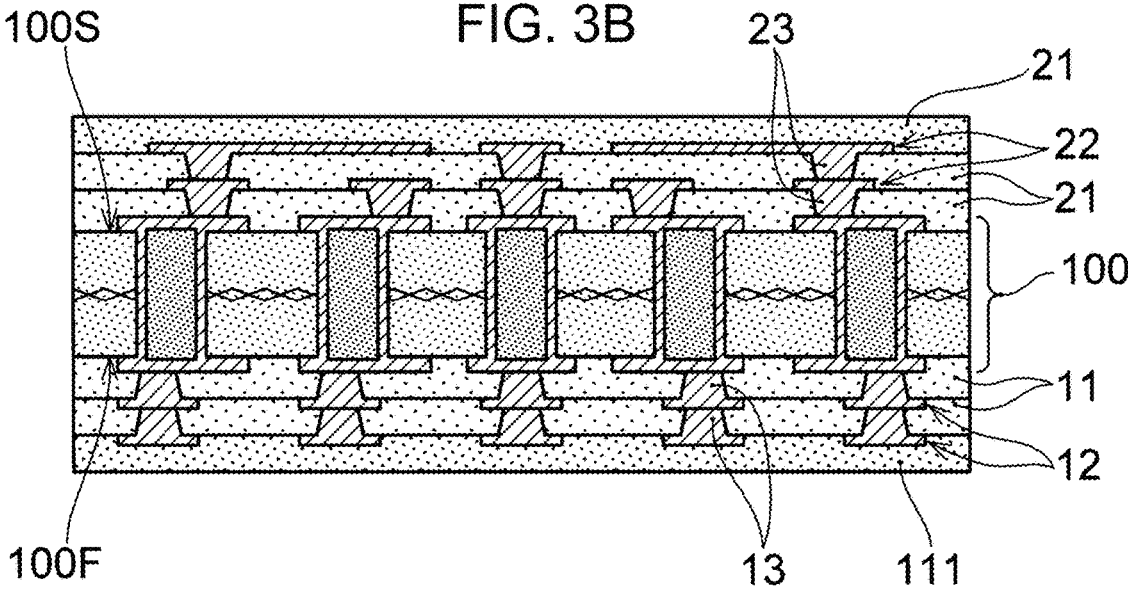
FIG. 3B is a cross-sectional view illustrating an example of a method for manufacturing a wiring substrate according to an embodiment of the present invention.

Next, as illustrated in FIG. 3B, the multiple insulating layers (11, 111) and conductor layers 12 are alternately laminated on the first surface (100F) of the core substrate 100, and the multiple insulating layers 21 and conductor layers 22 are alternately laminated on the second surface (100S) of the core substrate 100. For example, the insulating layers (11, 21) in contact with the core substrate 100 may be formed by thermocompression bonding a film-like insulating resin onto the core substrate 100.

The conductor layers (12, 22) are formed using a method for forming conductor patterns, such as a semi-additive method, at the same time as the via conductors (13, 23) filling openings that are formed in the insulating layers (11, 21), for example, using laser. The formation of the insulating layers (11, 21) and the conductor layers (12, 22) is repeated, and as illustrated, the outermost insulating layer (first insulating layer) 111 on the first surface (100F) side and the outermost insulating layer 21 on the second surface (100S) side are laminated. The multiple insulating layers (11, 111) and conductor layers 12 laminated on the first surface (100F) and the multiple insulating layers 21 and conductor layers 22 laminated on the second surface (100S) are the same in number of layers.

In particular, among the three insulating layers (11, 111) laminated on the first surface (100F) side, the outermost insulating layer (first insulating layer) 111 is formed as an insulating layer that, in the cured state, has physical properties different from those of the insulating layers 11 on the inner side of the insulating layer 111. Specifically, the first insulating layer 111 is formed to have a higher tensile strength than the insulating layers 11 on the inner side of the first insulating layer 111. For example, the first insulating layer 111 having a higher tensile strength than the insulating layers 11 may be formed by pressing and curing a resin film that has a composition (for example, a resin component or a cross-linking agent content) different from the insulating layers 11 onto the conductor layer 12.

The multiple (three in the illustrated example) insulating layers 21 laminated on the second surface (100S) side are formed to have a layer structure symmetric to the multiple (three in the illustrated example) insulating layers (11, 111) laminated on the first surface (100F) side with respect to the core substrate 100. In this case, insulating layers of the same rank relative to the core substrate 100 are formed using the same material. Therefore, the outermost insulating layer 21 of the wiring substrate 1 to be manufactured is formed by pressing a resin film of the same material as the first insulating layer 111 onto the conductor layer 22. Similar to the first insulating layer 111, the insulating layer 21 laminated outermost on the second surface (100S) side of the core substrate 100 is formed to have a higher tensile strength than the inner-side insulating layers 21 (the two insulating layers 21 near the core substrate 100 in the illustrated example).

Figure 3C:
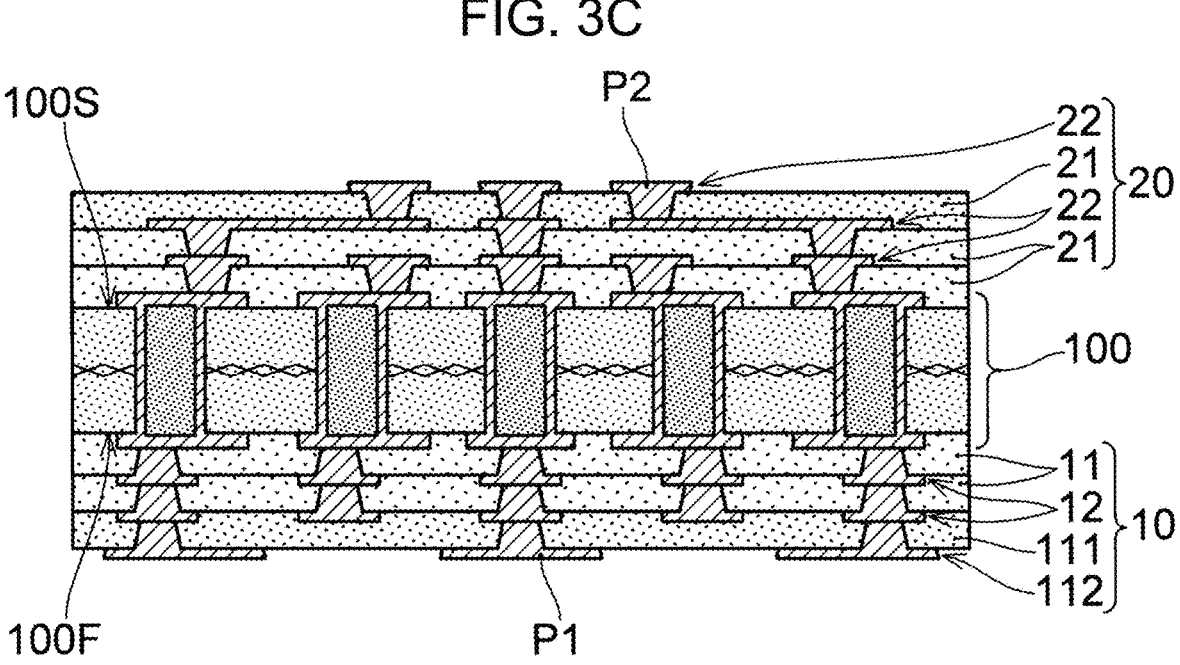
FIG. 3C is a cross-sectional view illustrating an example of a method for manufacturing a wiring substrate according to an embodiment of the present invention.

Subsequently, as illustrated in FIG. 3C, conductor layers are respectively formed on the outermost first insulating layer 111 on the first surface (100F) side and the outermost insulating layer 21 on the second surface (100S) side. Using the same method as that for the formation of the via conductors (13, 23) and the conductor layers (12, 22) described above, the via conductors 13 penetrating the outermost first insulating layer 111 on the first surface (100F) side and the outermost first conductor layer 112 are integrally formed, and the via conductors 23 penetrating the outermost insulating layer 21 on the second surface (100S) side and the outermost conductor layer 22 are integrally formed.

The outermost first conductor layer 112 is formed to have patterns including the first conductor pads (P1). The outermost conductor layer 21 is formed to have patterns including the conductor pads (P2). The surface treatment layer may be formed on the surfaces of the first conductor pads (P1) and the conductor pads (P2). For example, by applying a heat-resistant organic substance by spraying, an organic coating film containing an organic substance such as an imidazole compound may be formed. Or, for example, by depositing a metal such as nickel, palladium, or gold by electroless plating or the like, a metal coating film may be formed. As a result, the formation of the first build-up part 10 and the second build-up part 20 on both sides of the core substrate 100 is completed.

Figure 3D:
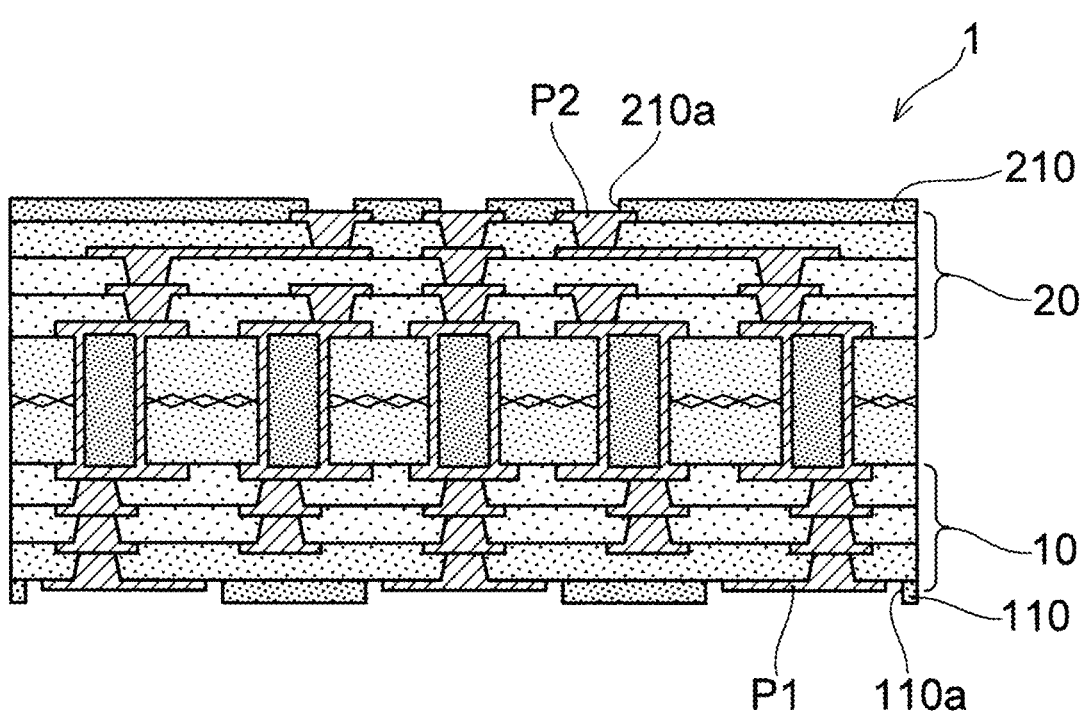
FIG. 3D is a cross-sectional view illustrating an example of a method for manufacturing a wiring substrate according to an embodiment of the present invention.

Subsequently, as illustrated in FIG. 3D, the covering insulating layer 110 is formed on the first build-up part 10, and the covering insulating layer 210 is formed on the second build-up part 20. In the insulating layer 110, the openings (110a) exposing the first conductor pads (P1) are formed. In the insulating layer 210, the openings (210a) exposing the conductor pads (P2) are formed. For example, each of the covering insulating layers (110, 210) may be formed by forming a photosensitive epoxy resin film by spray coating, curtain coating, or film pasting, and the openings (110a, 210a) may be formed by exposure and development. The openings (110a) are formed to expose the peripheral edges of the first conductor pads (P1), and the entire side surfaces and upper surfaces of the first conductor pads (P1) are exposed in the openings (110a).

The wiring substrate of the embodiment is not limited to those having the structures illustrated in the drawings and those having the structures, shapes, and materials exemplified in the present specification. The wiring substrate of the embodiment includes the core substrate and the first build-up part. The entire surfaces (side surfaces and upper surfaces) of the first conductor pads in the first build-up part are exposed from the covering insulating layer. The tensile strength of the first insulating layer may be higher than the tensile strength of the insulating layers on the inner side of the first insulating layer. For example, the wiring substrate of the embodiment may include any number of conductor layers and any number of insulating layers.

Japanese Patent Application Laid-Open Publication No. 2004-22713 describes a multilayer wiring substrate having a pad part that is formed on an insulating layer and is bonded to a semiconductor element. A solder resist is provided on the insulating layer, and the pad part is formed in an opening of the solder resist in a state of being separated from the solder resist.

In a conductor pad formed on an insulating layer, such as a pad part described in Japanese Patent Application Laid-Open Publication No. 2004-22713, and the insulating layer as a lower layer of the connection pad, a stress may occur due to a difference in thermal expansion coefficient between the conductor pad and the insulating layer, or due to an external force applied from an external component connected to the conductor pad. Therefore, it is thought that a defect such as a crack due to the stress is likely to occur in the insulating layer near the conductor pad.

A wiring substrate according to an embodiment of the present invention includes: a core substrate having a first surface and a second surface on the opposite side with respect to the first surface; a first build-up part that is formed on the first surface of the core substrate and includes multiple insulating layers and a conductor layer; and a covering insulating layer covering an outermost surface of the first build-up part. The first build-up part includes: an outermost first insulating layer among the multiple insulating layers; and a first conductor layer that is formed on the first insulating layer and includes a first conductor pad. The covering insulating layer has an opening that exposes entire upper surface and side surface of the first conductor pad. A tensile strength of the first insulating layer is higher than a tensile strength of an insulating layer other than the first insulating layer in the first build-up part.

According to an embodiment of the present invention, a wiring substrate is provided in which a tensile strength of a first insulating layer in contact with a first conductor pad provided in the wiring substrate is increased and it is thought that occurrence of a defect such as a crack in the insulating layer around the first conductor pad is suppressed.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a core substrate;
a first build-up part formed on a first surface of the core substrate and comprising a plurality of insulating layers and a plurality of conductor layers;
a second build-up part formed on a second surface of the core substrate on an opposite side with respect to the first surface of the core substrate and comprising a conductor layer;

a first covering insulating layer formed on the first build-up part such that the first covering insulating layer is covering an outermost surface of the first build-up part; and a second covering insulating layer formed on the second build-up part such that the second covering insulating layer is covering an outermost surface of the second build-up part, wherein the first build-up part is formed such that the plurality of insulating layers includes a first insulating layer forming an outermost one of the insulating layers, that the plurality of conductor layers is laminated on the insulating layers respectively and includes a first conductor layer formed on the first insulating layer and including a plurality of first conductor pads, and that a tensile strength of the first insulating layer is higher than a tensile strength of each of the insulating layers other than the first insulating layer in the first build-up part, the first covering insulating layer is formed such that the first covering insulating layer has a plurality of openings entirely exposing upper surfaces and side surfaces of the first conductor pads, respectively, and the second covering insulating layer has a plurality of openings exposing portions of the conductor layer in the second build-up part respectively such that the openings of the second covering insulating layer define a plurality of second conductor pads, respectively.

2. The wiring substrate according to claim 1, wherein the first build-up part is formed such that each of the first conductor pads of the first conductor layer is not directly connected to another pad in the first conductor layer or a wiring in the first conductor layer.

3. The wiring substrate according to claim 1, wherein the first build-up part is formed such that the tensile strength of the first insulating layer is 125 MPa or greater.

4. The wiring substrate according to claim 1, wherein the first build-up part is formed such that the first insulating layer has a dielectric loss tangent of 0.013 or less at a frequency of 5.8 GHz.

5. The wiring substrate according to claim 1, wherein the second build-up part is formed such that the second build-up part includes a plurality of insulating layers and that a number of the insulating layers in the second build-up part is equal to a number of the insulating layers in the first build-up part.

6. The wiring substrate according to claim 5, wherein the second build-up part is formed such that the first insulating layer in the first build-up part and the outermost insulating layer in the second build-up part are formed of a same material.

7. The wiring substrate according to claim 1, wherein the first build-up part is formed such that the plurality of conductor layers includes a second conductor layer formed on an opposite side with respect to the first conductor layer via the first insulating layer and that the first build-up part includes a plurality of via conductors penetrating through the first insulating layer and connecting the second conductor layer and the first conductor pads of the first conductor layer, respectively.

8. The wiring substrate according to claim 2, wherein the first build-up part is formed such that the tensile strength of the first insulating layer is 125 MPa or greater.

9. The wiring substrate according to claim 2, wherein the first build-up part is formed such that the first insulating layer has a dielectric loss tangent of 0.013 or less at a frequency of 5.8 GHz.

10. The wiring substrate according to claim 2, wherein the second build-up part is formed such that the second build-up part includes a plurality of insulating layers and that a number of the insulating layers in the second build-up part is equal to a number of the insulating layers in the first build-up part.

11. The wiring substrate according to claim 10, wherein the second build-up part is formed such that the first insulating layer in the first build-up part and the outermost insulating layer in the second build-up part are formed of a same material.

12. The wiring substrate according to claim 2, wherein the first build-up part is formed such that the plurality of conductor layers includes a second conductor layer formed on an opposite side with respect to the first conductor layer via the first insulating layer and that the first build-up part includes a plurality of via conductors penetrating through the first insulating layer and connecting the second conductor layer and the first conductor pads of the first conductor layer, respectively.

13. The wiring substrate according to claim 3, wherein the first build-up part is formed such that the first insulating layer has a dielectric loss tangent of 0.013 or less at a frequency of 5.8 GHz.

14. The wiring substrate according to claim 3, wherein the second build-up part is formed such that the second build-up part includes a plurality of insulating layers and that a number of the insulating layers in the second build-up part is equal to a number of the insulating layers in the first build-up part.

15. The wiring substrate according to claim 14, wherein the second build-up part is formed such that the first insulating layer in the first build-up part and the outermost insulating layer in the second build-up part are formed of a same material.

16. The wiring substrate according to claim 3, wherein the first build-up part is formed such that the plurality of conductor layers includes a second conductor layer formed on an opposite side with respect to the first conductor layer via the first insulating layer and that the first build-up part includes a plurality of via conductors penetrating through the first insulating layer and connecting the second conductor layer and the first conductor pads of the first conductor layer, respectively.

17. The wiring substrate according to claim 4, wherein the second build-up part is formed such that the second build-up part includes a plurality of insulating layers and that a number of the insulating layers in the second build-up part is equal to a number of the insulating layers in the first build-up part.

18. The wiring substrate according to claim 17, wherein the second build-up part is formed such that the first insulating layer in the first build-up part and the outermost insulating layer in the second build-up part are formed of a same material.

19. The wiring substrate according to claim 4, wherein the first build-up part is formed such that the plurality of conductor layers includes a second conductor layer formed on an opposite side with respect to the first conductor layer via the first insulating layer and that the first build-up part includes a plurality of via conductors penetrating through the first insulating layer and connecting the second conductor layer and the first conductor pads of the first conductor layer, respectively.

20. The wiring substrate according to claim 5, wherein the first build-up part is formed such that the plurality of conductor layers includes a second conductor layer formed on an opposite side with respect to the first conductor layer via the first insulating layer and that the first build-up part includes a plurality of via conductors penetrating through the first insulating layer and connecting the second conductor layer and the first conductor pads of the first conductor layer, respectively.

* * * * *